United States Patent [19]
Kitsukawa et al.

[11] Patent Number: 5,844,853
[45] Date of Patent: Dec. 1, 1998

[54] MEMORY REGULATOR CONTROL METHOD WITH FLEXIBILITY FOR A WIDE CHANGE IN SUPPLY VOLTAGE

[75] Inventors: Goro Kitsukawa, Hinode-machi, Japan; Wah Kit Loh, Richardson, Tex.; Takesada Akiba, Tachikawa, Japan; Masayuki Nakamura; Hiroshi Otori, both of Ome, Japan

[73] Assignees: Texas Instruments, Inc., Dallas, Tex.; Hitachi, Ltd., Tokyo, Japan

[21] Appl. No.: 790,610

[22] Filed: Jan. 29, 1997

Related U.S. Application Data

[60] Provisional application No. 60/010,226 Feb. 1, 1996.
[51] Int. Cl.⁶ .................................................. G11C 7/10
[52] U.S. Cl. ........................................ 365/226; 365/189.09
[58] Field of Search ................................. 365/226, 189.09

[56] References Cited

U.S. PATENT DOCUMENTS

| | | |
|---|---|---|
| 4,994,688 | 2/1991 | Horiguchi et al. .................... 327/541 |
| 5,144,585 | 9/1992 | Min et al. ............................. 365/226 |
| 5,297,097 | 3/1994 | Etoh et al. ............................ 365/226 |
| 5,448,526 | 9/1995 | Horiguchi et al. .................... 365/226 |
| 5,485,509 | 1/1996 | Oliver ................................ 379/106.6 |
| 5,612,920 | 3/1997 | Tomishima ........................... 365/226 |
| 5,631,547 | 5/1997 | Fujioka et al. ....................... 323/273 |

*Primary Examiner*—David C. Nelms
*Assistant Examiner*—Hoavi V. Ho
*Attorney, Agent, or Firm*—Hayes and Boone, L.L.

[57] ABSTRACT

A circuit and method for providing a plurality of voltage regulators whose outputs are constant for ranges of different external voltages are disclosed. The voltage regulators are made to be adaptable to two different ranges of external voltages through use of a master-slice technique. Furthermore, in a first voltage regulator, the supply current capability of the regulator is significantly increased under very low external voltage conditions. In a second voltage regulator, the voltage level on any node of the regulator does not exceed a voltage level that is too high, yet still sinks most of its current from the external power supply. A third voltage regulator is able to charge and discharge its output voltage so that it will maintain at a constant level. Finally, a fourth voltage regulator is optimized to reduce dielectric leakage.

37 Claims, 8 Drawing Sheets

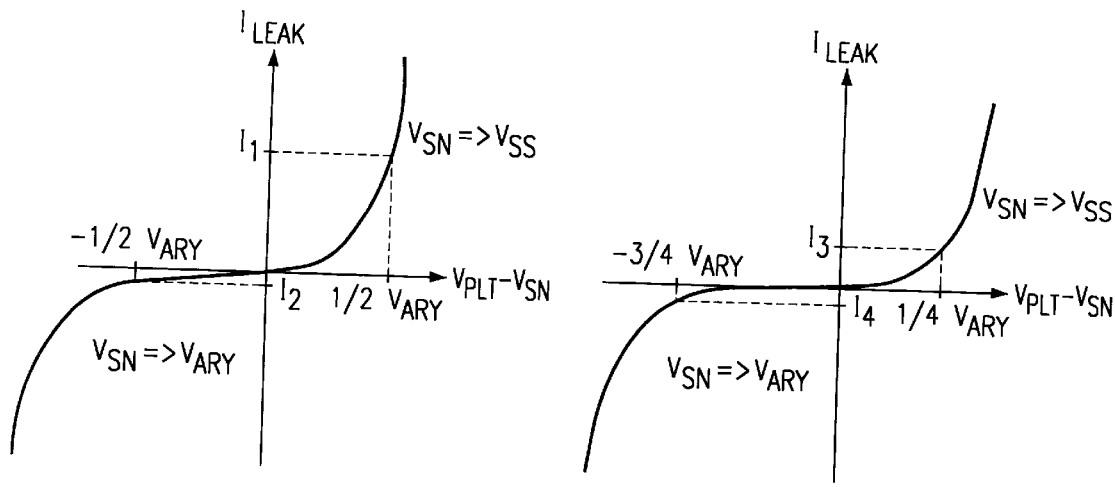
Fig. 16
(PRIOR ART)
Fig. 17
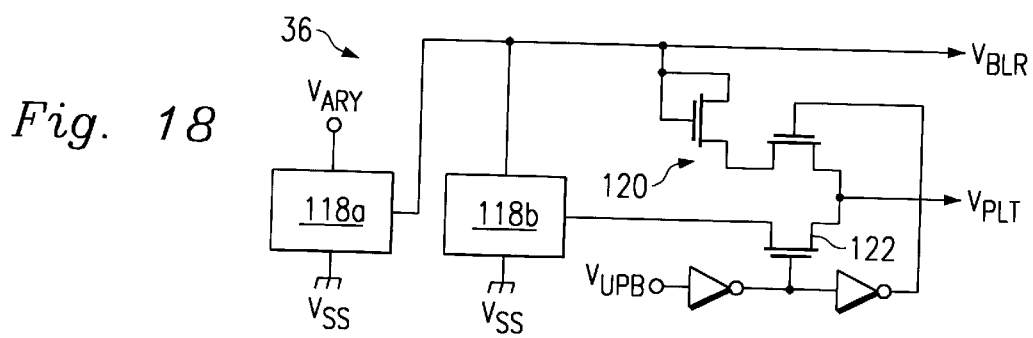
Fig. 18
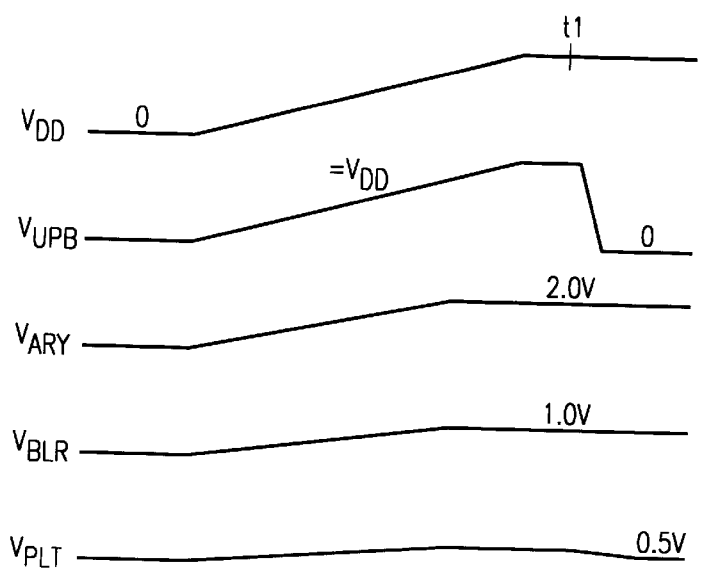
Fig. 19

MEMORY REGULATOR CONTROL METHOD WITH FLEXIBILITY FOR A WIDE CHANGE IN SUPPLY VOLTAGE

CROSS REFERENCE

This application claims the benefit of U.S. Provisional application Ser. No. 60/010,226, filed Feb. 1, 1996.

BACKGROUND OF THE INVENTION

The present invention relates generally to semiconductor design technology, and more particularly, to a system and method for regulating internal voltage sources in a semiconductor circuit capable of operating at different supply voltage levels.

Due to many technological advances, integrated circuits, or "chips," incorporate many millions of transistors on a single monolithic device. This provides many advantages, including improved speed and reduced size. However, chip speed, power dissipation and reliability become more of a concern as the number of transistors increases. In response, external power supply requirements for many chips have been reduced. For example, a conventional 16 Mbit dynamic random access memory ("DRAM") utilizes either a 5.0 Volt (V) or 3.3 V external power supply, but a 256 Mbit DRAM utilizes either a 3.3 V or 2.5 V external power supply. As a result of reducing the external power supply, power dissipation and reliability problems such as junction breakdown, which is caused by applying a voltage that is too high for a thin transistor gate or a thin capacitor dielectric, can be reduced. However, these benefits are typically at the cost of reduced chip speed.

Another trend is for providing selectable-voltage power supplies to create different DRAM versions. For example, referring to FIGS. 1a and 1b, a conventional 16 Mbit DRAM has a 5 V version 2a connected to an external positive power supply (VDD) of 5 V and a 3.3 V version 2b connected to a VDD of 3.3 V. Both versions 2a, 2b are also connected to a ground external power supply (VSS) and contain internal voltage sources such as those described in U.S. Pat. Nos. 5,144,585, 4,994,688, 5,297,097. For the most part, the 5 V version 2a and the 3.3 V version 2b are identical. However, in the 5 V version 2a, a voltage regulator 3 regulates the VDD voltage to an internal voltage level (VINT) of about 3.3 V for memory cells and peripheral circuits 4. VINT must be relatively low to work with the small memory cell circuits of the DRAM's array (not shown), as well as to reduce the overall power consumption of the DRAM. Output circuits 5, however, work off the higher VDD voltage. In this way, the speed of the output circuits 5 is enhanced and the output circuits operate at a desired voltage level. Alternatively, in the 3.3 V version 2b, a 3.3 V voltage is already supplied by the external VDD. Therefore, there is no regulator for the 3.3 V version 2a like the regulator 3 of the 5 V version because the external voltage is already at or near VINT and memory cells, peripheral circuits and output circuits 4, 5 work off the same VDD voltage level.

To meet the requirements of selectable-voltage power chips, a chip design typically adopts a master-slice technique. When a chip is designed, a mask set of many mask layers is created, such as is described in U.S. Pat. No. 5,485,509. With the master-slice technique, all of the mask layers used to build each version of the chip are the same except for one. Referring again to FIGS. 1a and 1b, in the 5 V version 2a, the DRAM includes a first layer 6 that directs the VDD voltage to the regulator 3, and the regulated voltage to the corresponding circuits. Alternatively, the 3.3 V version 2b would include a second layer 7 that directs the VDD voltage directly to the corresponding circuits 4,5.

Such a simple master-slice technique does not work as well in a 256 Mbit DRAM. In particular, a dielectric material used for a 256 Mbit DRAM memory cell requires a very small internal voltage that balances dielectric leakage characteristics and memory cell stability, while circuits in an area peripheral to the memory cell area require another internal voltage that balances speed and power consumption. Furthermore, additional voltage regulators are required, each having many design difficulties associated therewith. For example, when the external power supply to a voltage regulator is very low, it is difficult for the regulator to supply a significant current output. Also, when the external power supply is high, some nodes of a charge pumping voltage regulator can reach an extremely high voltage, causing reliability problems. Finally, conventional voltage regulators are not able to charge and discharge an output voltage so that they will maintain the output voltage at a constant level.

SUMMARY OF THE INVENTION

The present invention, accordingly, provides a circuit and method for providing a plurality of voltage regulators whose outputs are constant for many different external voltages. In the preferred embodiment, the voltage regulators are adaptable to two different ranges of external voltage by utilizing a master-slice technique. In a first voltage regulator, the supply current capability of the regulator is significantly increased under very low external voltage conditions. In a second charge pumping voltage regulator, the voltage level on any node of the regulator does not exceed a predetermined high voltage level, yet still sinks most of its current from the external power supply. A third voltage regulator is able to charge and discharge its output voltage to maintain it at a constant level. Finally, a fourth voltage regulator is optimized to reduce dielectric leakage.

BRIEF DESCRIPTION OF THE DRAWINGS

FIG. 4a is a block diagram of the voltage regulators used by the DRAM of FIG. 3a.

FIG. 5a is a graph of operating voltage vs. internal voltage corresponding to the DRAM of FIG. 3a.

FIG. 16 is a graph of voltage vs. current of a conventional fourth voltage regulator, illustrating the leakage current thereof.

FIG. 17 is a graph of voltage vs. current of the fourth voltage regulator of the present invention, illustrating the leakage current thereof.

FIG. 18 is a schematic diagram of the fourth voltage regulator embodying features of the present invention.

FIG. 19 is a timing diagram of the signals shown in FIG. 18.

DETAILED DESCRIPTION OF THE PREFERRED EMBODIMENT

Figure 1A:
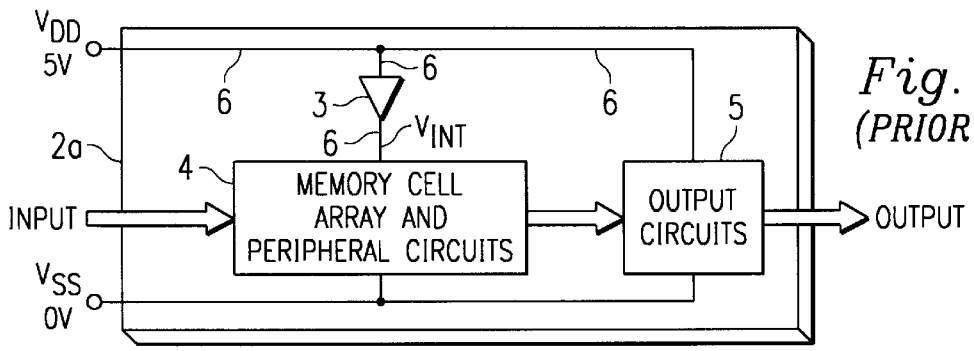
FIG. 1a is a block diagram of a 5 V version of a conventional 16 Mbit DRAM.
Figure 1B:
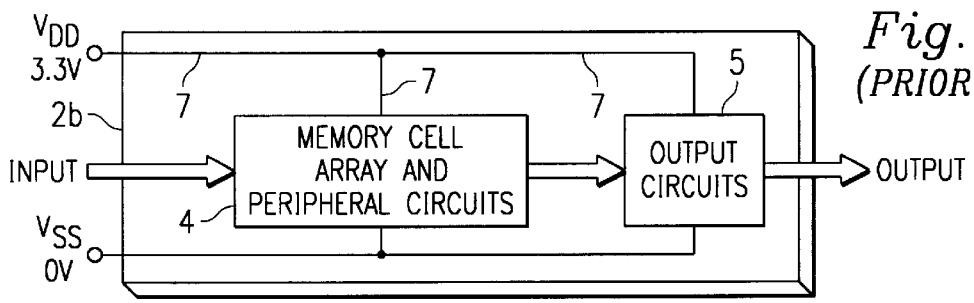
FIG. 1b is a block diagram of a 3.3 V version of a conventional 16 Mbit DRAM.

As described above, FIGS. 1a and 1b respectively illustrate a 5 V and 3.3 V version of a conventional 16 Mbit dynamic random access memory ("DRAM") device.

Figure 2A:
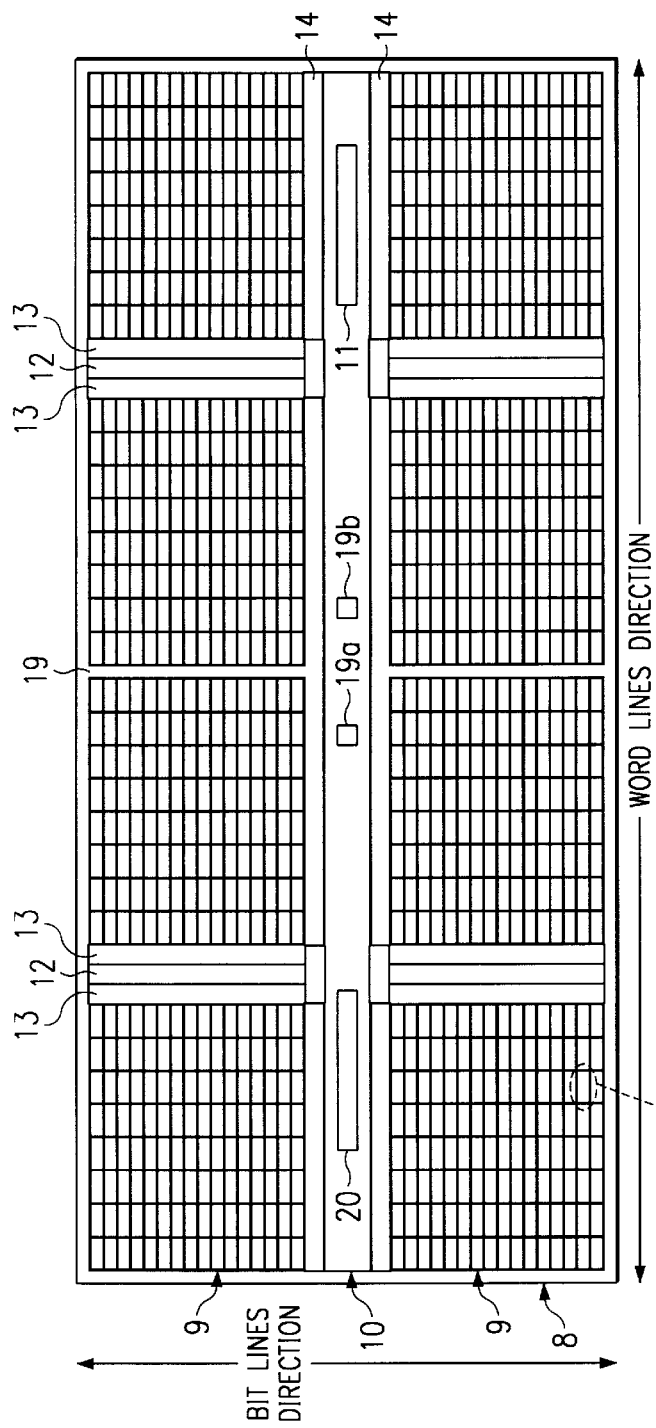
FIGS. 2a and 2b are diagrams of a 256 Mbit DRAM embodying features of the present invention.
Figure 2B:
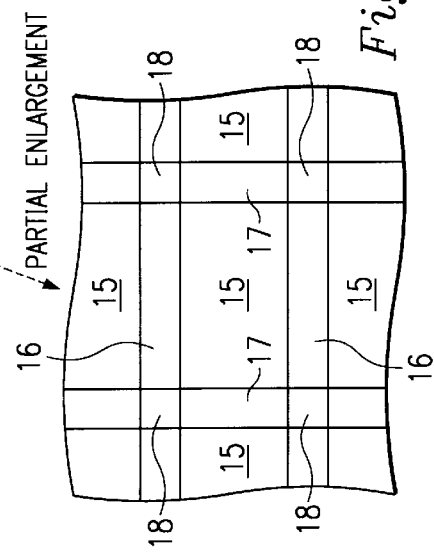

Referring to FIG. 2, the reference numeral 8 designates, in general, a 256 Mbit DRAM embodying features of the present invention. It is understood, however, that the 256 Mbit DRAM is merely illustrative of many different devices that may benefit from the present invention, including a 64 Mbit DRAM or any selectable-voltage integrated circuit device requiring different internal power supply levels. Furthermore, the voltage levels listed below are for descriptive purposes only, and are not intended to limit the invention.

The DRAM 8 includes memory cell arrays 9 and peripheral circuits 10, both described in greater detail in U.S. Pat. Nos. (Ser. No. 08/728,447 and 60/008,264), which are herein incorporated by reference. The peripheral circuits 10 include some centralized peripheral circuits 11, main row decoders 12, word line drivers 13, and column decoders 14. Also, the memory cell arrays 9 can be subdivided into memory cell regions 15, thereby illustrating additional peripheral circuits 10 including sense amplifiers 16, sub-word line drivers 17, and control circuits 18. Furthermore, the DRAM 8 includes a plurality of pads, such as pad 19a and 19b, a plurality of output circuits 20, and several voltage regulators (now shown), to be discussed in greater detail below.

Figure 3A:
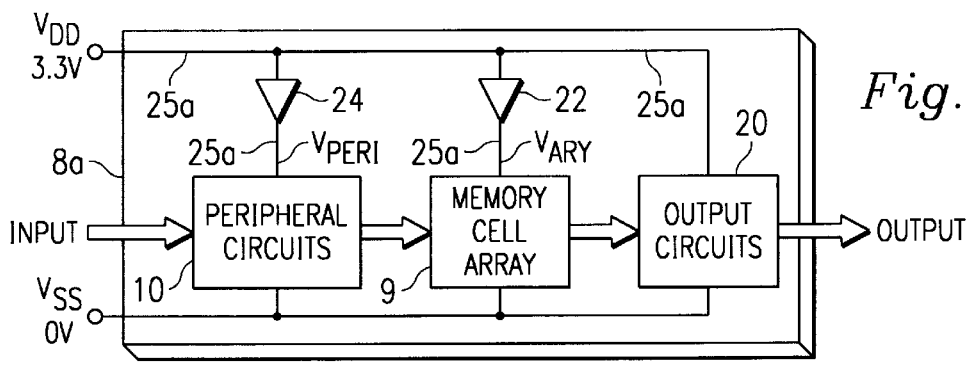
FIG. 3a is a block diagram of a 3.3 V version of the 256 Mbit DRAM of FIG. 2.
Figure 3B:
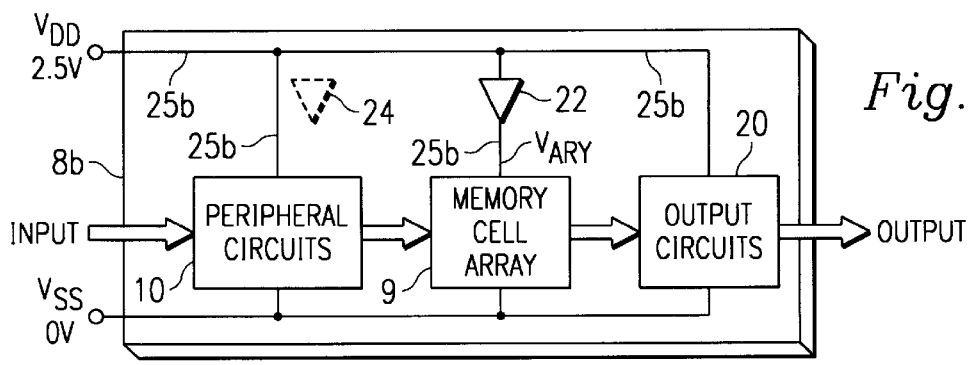
FIG. 3b is a block diagram of a 2.5 version of the 256 Mbit DRAM of FIG. 2.

Referring to FIGS. 3a and 3b, the reference numerals 8a and 8b designate, in general, a 3.3 V version and a 2.5 V version, respectively, of the DRAM. The devices 8a and 8b receive positive external power (VDD) and ground external power (VSS) through the pads 19a, 19b (FIG. 2a), respectively, such that the VDD voltage equals 3.3 V for the device 8a and 2.5 V for the device 8b, and the VSS voltage equals 0 V for both devices. For the most part, the 3.3 V device 8a and the 2.5 V device 8b are identical, in that each comprise the same memory cell array 9, peripheral circuits 10, and output circuits 20. Furthermore, both devices 8a, 8b comprise first and second voltage regulators 22, 24, respectively. In both devices 8a, 8b, the first voltage regulator 22 supplies an array voltage (VARY) of about 2.0 V to the memory cell arrays 9. In the 3.3 V device 8a, the second voltage regulator 24 supplies a peripheral voltage (VPERI) of about 2.5 V for peripheral circuits 10. However, in the 2.5 V device 8b, the second voltage regulator 24 is disabled, as described below.

The voltage regulators 22, 24 are used for various purposes. First of all, VARY must be very low and stable to work with thin (3–4 nm) dielectric material used in the memory cell arrays 9. By having such a low VARY, dielectric leakage characteristics are kept at a minimum while still maintaining high memory cell stability. Secondly, VPERI is higher than VARY because the peripheral circuits 10 have transistors with a larger gate thickness (9–10 nm) than the memory cell dielectric thickness. By having an intermediate voltage (VARY<VPERI<VDD) for VPERI, the speed of the peripheral circuits 10 is improved without significantly increasing power consumption caused by the relatively large number of peripheral circuits. Finally, output circuits 20 work off the VDD voltage. In this way, the speed of the output circuits 20 is greatly increased, the voltage levels of the output signals are at a desired operating level, and the power consumption, although increased by the high voltage of VDD, is limited by the relatively small number of output circuits.

Alternatively, in the 2.5 V device 8b, the second voltage regulator 24 of FIG. 3a is not needed because the VDD voltage (2.5 V) equals VPERI (2.5 V). Therefore, the master-slice technique is implemented so that, by using a first mask layer (not shown), the 3.3 V device 8a includes a metal layer 25a that activates the first and second voltage regulators 22, 24 for supplying the VPERI and VARY, respectively. By using a second mask layer (also not shown) instead of the first mask layer, the 2.5 V device 8b includes a metal layer 25b that activates the first voltage regulator 22 for supplying VARY but bypasses the second voltage regulator 24. As a result, the device 8b does not use the second voltage regulator 24 so that VDD directly supplies the VPERI voltage.

Figure 4A:
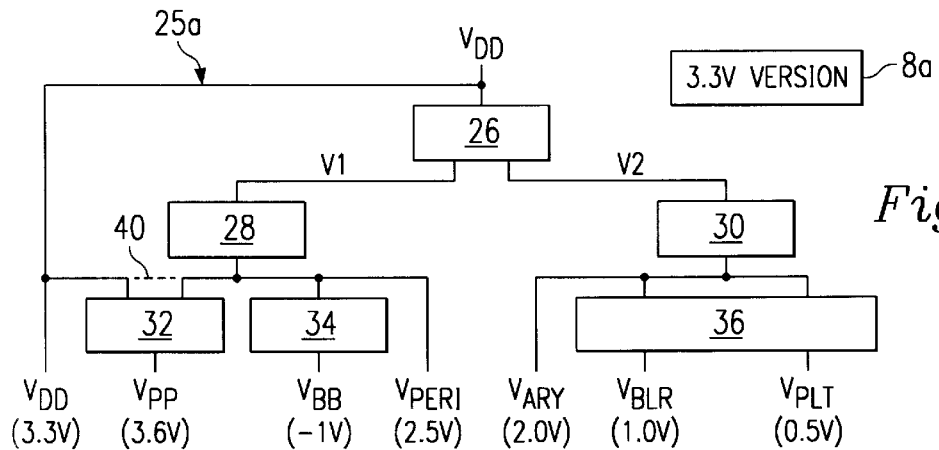
Figure 4B:
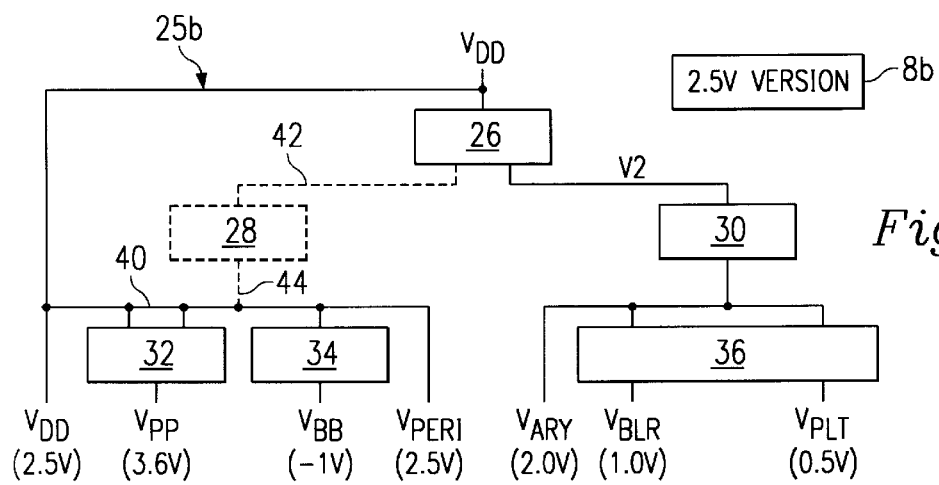
FIG. 4b is a block diagram of the voltage regulators used by the DRAM of FIG. 3b.

Referring to FIGS. 4a and 4b, both devices 8a, 8b, in addition to regulating the internal voltages VARY and VPERI, generate and utilize additional internal voltages VPP, VBB, VBLR, and VPLT. VPP is 3.6 V and is used by word line circuits, VBB is −1.0 V and is used as a back bias for various transistors, VBLR is 1.0 V and is used as a bit line equalization level, and VPLT is 0.5 V and is used to charge a plate of a memory cell capacitor. All of the internal voltages VARY, VPERI, VPP, VBB, VBLR, and VPLT will be discussed in greater detail below.

Referring in particular to the block diagram of FIG. 4a, which corresponds to the 3.3 V device 8a of FIG. 3a, the internal voltages VARY, VPERI, VPP, VBB, VBLR, and VPLT are regulated by six voltage regulators 26, 28, 30, 32, 34 and 36 which are interconnected by various power and signal lines. The intermediate voltage regulator 26 is a voltage divider that generates a first intermediate voltage V1 and a second intermediate voltage V2, such that the V1 voltage equals 1.25 V and the V2 voltage equals 1.0 V. V1 is supplied to the VPERI regulator 28, which generates VPERI as described in greater detail with reference to FIG. 7. VPERI is also supplied to the VBB regulator 34 and to the VPP regulator 32, which is described in greater detail with reference to FIG. 12.

Likewise, V2 is supplied to the VARY regulator 30, which generates VARY as described in greater detail with reference to FIG. 10. VARY is also supplied to the VBLR and VPLT regulator 36, as described in greater detail with reference to FIG. 18.

Referring to the block diagram of FIG. 4b, which corresponds to the 2.5 V device 8b of FIG. 3b, the internal voltages VARY, VPERI, VPP, VBB, VBLR, and VPLT are generated in a similar manner as described above in reference to FIG. 4a, except that VPERI is directly supplied by VDD.

The broken lines of FIGS. 4a and 4b illustrate how the master-slice technique is implemented in the preferred embodiment. The first mask layer 25a used for the 3.3 V device 8a, includes all of the lines connecting the regulators 26, 28, 30, 32, 34, 36 except for a line segment 40 connecting the external VDD to VPERI, which is shown in FIG. 4a as a broken line. Likewise, the second mask layer 25b used for the 2.5 V device 8b, includes the lines interconnecting the regulators 26, 30, 32, 34, 36, 38 except for line segments 42 and 44, connecting the VPERI regulator 28, which are shown in FIG. 4b as broken lines.

Figure 5A:
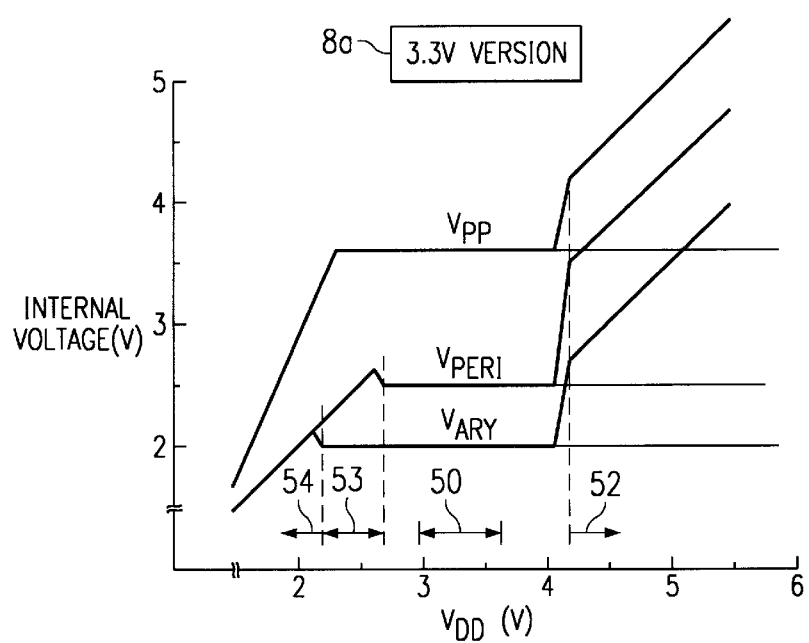

Referring to FIG. 5a, the three internal voltages VPP, VPERI and VARY of the 3.3 V version device 8a (FIG. 3a) are shown as a function of VDD. A normal operation range 50 for VDD is 3.3 V plus or minus 10%, or 3.0 V–3.6 V. Throughout the normal range 50, the internal voltages VPP, VPERI and VARY are constantly 3.6 V, 2.5 V, and 2.0 V, respectively. In a stress range 52, used for reliability and burn-in test when VDD is greater than 4.1 V, the internal voltages VPP, VPERI and VARY vary with VDD voltage such that VPP equals VDD, VPERI equals VDD minus 0.75 V, and VARY equals VDD minus 1.5 V. In a first low voltage range 53 used during power up or battery backup operation, when VDD is between 2.2 V and 2.7 V, VARY still equals 2.0 V, but VPERI equals VDD. Finally in a second low voltage range 54 also used during power-up, when VDD is less than 2.2 V, VARY and VPERI both equal VDD.

Figure 5B:
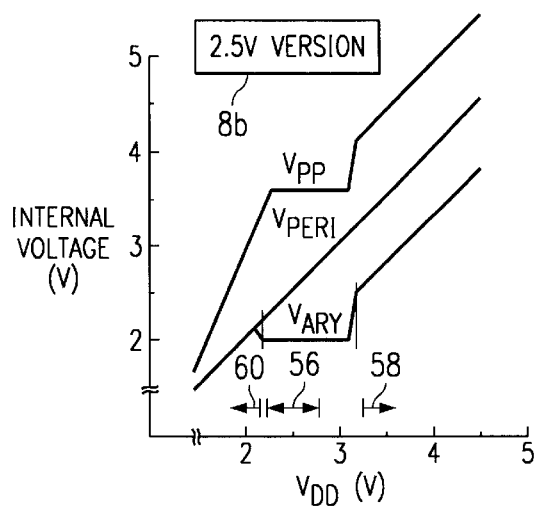
FIG. 5b is a graph of operating voltage vs. internal voltage corresponding to the DRAM of FIG. 3b.

Referring to FIG. 5b, the three internal voltages VPP, VPERI and VARY of the 2.5 V version device 8b (FIG. 3b) are shown as a function of VDD. A normal operation range 56 for VDD is 2.5 V plus or minus 10%, or 2.25 V–2.75 V. Throughout the normal range 56, the internal voltages VPP and VARY are constantly 3.6 V and 2.0 V, respectively, the same voltages as in the 3.3 V version (FIG. 5b). VPERI, however, remains equal to the VDD voltage. In a stress range 58, when VDD is greater than 3.2 V, VPP equals VDD plus 1.6 V, VPERI equals VDD and VARY equals VDD minus 0.75 V. Finally, in a low voltage range 60, when VDD is less than 2.2 V, VARY and VPERI both equal the VDD voltage.

Figure 6:
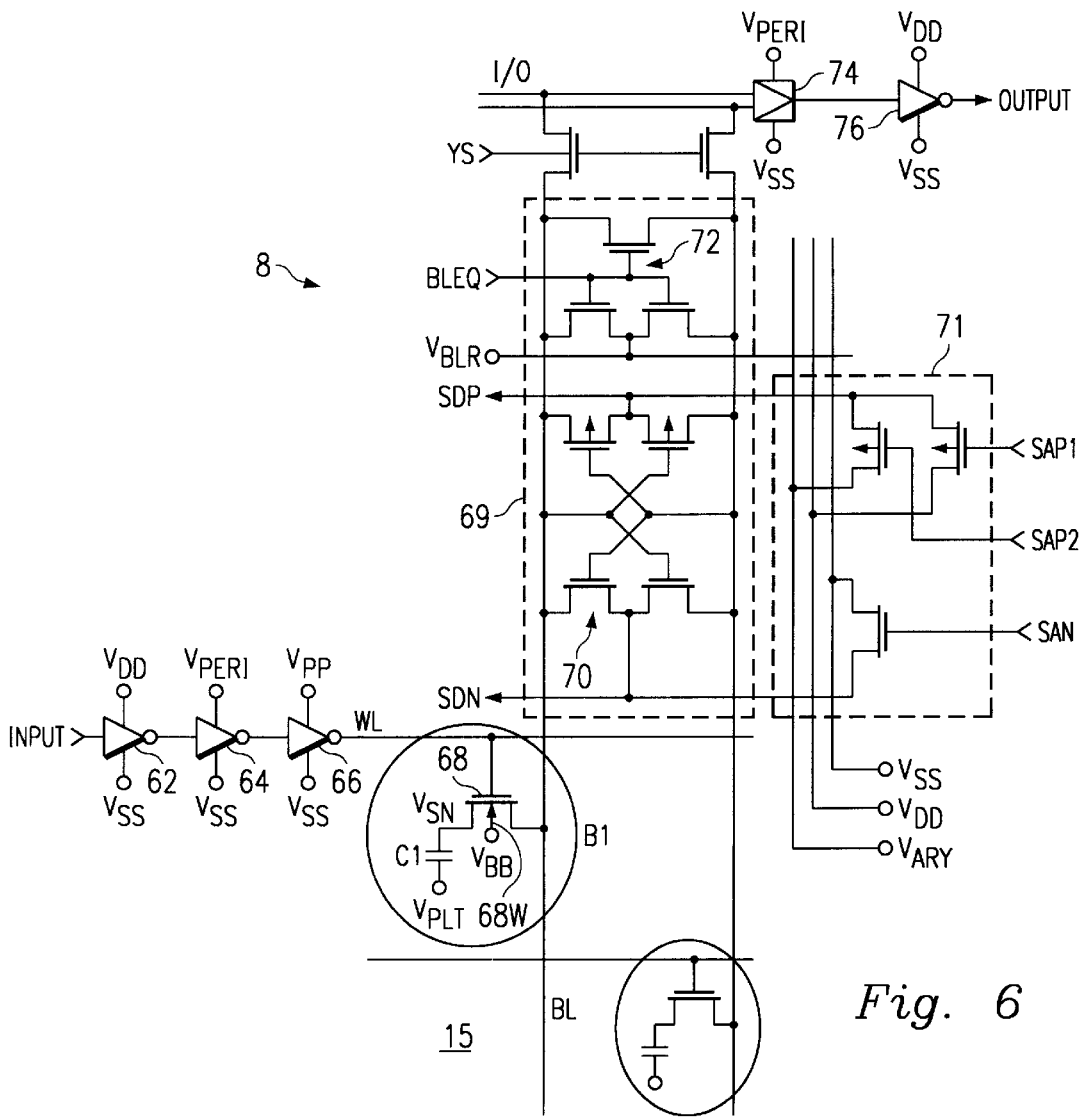
FIG. 6 is a schematic diagram of a simplified DRAM embodying features of the present invention.

Referring to FIGS. 2 and 6, selected circuits of the DRAM device 8 illustrate the application of the internal voltages VARY, VPERI, VPP, VBB, VBLR, and VPLT. In operation, an address signal (not shown) passes through an input port INPUT and into an address buffer 62. The address buffer 62 operates at VDD to interface with other chips and circuits (not shown). The address buffer 62 drives the address signal to a row decoder 64 of the main row decoders 12. The row decoder 64 operates at VPERI because VPERI provides a good balance between high speed (high voltage) and low power consumption (low voltage). The row decoder 64 drives the address signal to a word line driver 66 of the word line drivers 13 and sub-word line drivers 17, operating at VPP.

The word line driver 66 drives a word line WL, which selects a memory cell ("bit") B1 from the memory cell region 15. The bit B1 stores a bit voltage VSN between VARY (2.0 V) and VSS (0.0 V). Because the bit voltage VSN may be at VARY, the word line driver 66 operates at VPP to sufficiently exceed VARY plus a threshold voltage (not shown) of an n-channel metal oxide semiconductor ("NMOS") transistor 68 plus an additional voltage to accommodate for speed and voltage fluctuation. The transistor 68 has a well 68W biased to VBB, which reduces a leakage current (not shown) and a junction capacitance (also not shown) of the transistor 68. The bit B1 also includes a capacitor C1, which has one plate connected to VPLT. The level of VPLT is between VARY and VSS, and is optimized to minimize the leakage current of the capacitor C1, as described in greater detail with reference to FIG. 13.

The bit B1 drives the bit voltage VSN along a bit line BL to a sense amplifier circuit 69 of the sense amplifiers 16. The sense amplifier circuit 69 comprises an amplifier section 70 for amplifying the bit voltage VSN. The amplifier section 70 is controlled by an overdrive circuit 71 of the control circuits 18 through signal lines SDN and SDP. The overdrive circuit 71 receives three drive signals SAP1, SAP2 and SAN to drive the signal lines SDN to VSS and to selectively drive SDP to either VARY or VDD. VARY and VSS are the target high and low voltages, respectively, for the bit line BL, and VDD is used for short periods of time to overdrive the bit line BL. The sense amplifier circuit 69 also comprises an equalizer section 72 for precharging the bit line BL. The equalizer section 72 is controlled by a signal BLEQ so that before the bit B1 is selected by the word line WL, the bit line BL is at VBLR, which is exactly halfway between VARY and VSS.

An amplified bit line voltage (not shown) is selectively connected to an output line I/O by a column select signal YS. In turn, the output line I/O drives a main amp 74. The main amp 74 operates at VPERI for the same reasons discussed above with reference to the address decoder 64. Finally, the main amp 74 drives an output buffer 76 of the output circuits 20, which operates at VDD for the same reasons discussed above with reference to the input buffer 62, mentioned earlier.

Figure 7:
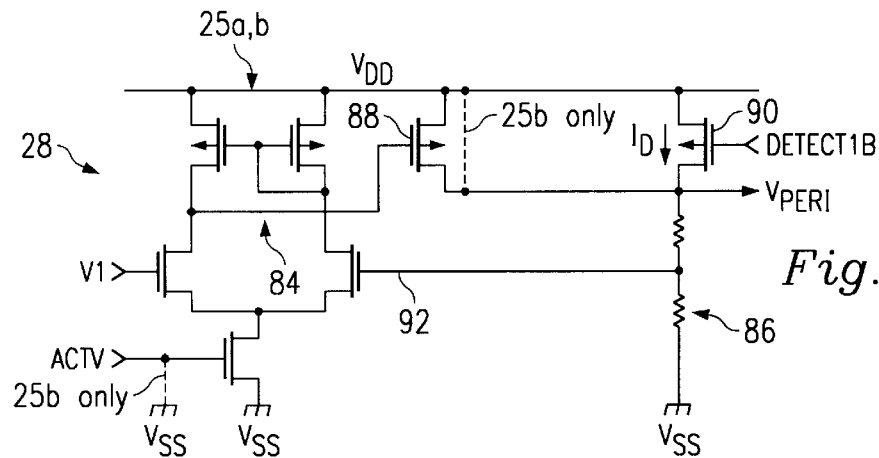
FIG. 7 is a schematic diagram of a first voltage regulator embodying features of the present invention.
Figure 8:
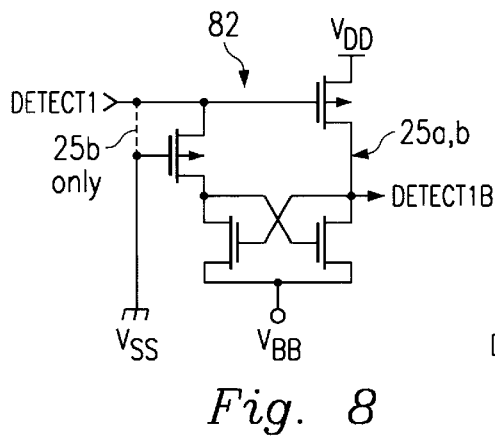
FIG. 8 is a schematic diagram of an inverter circuit embodying features of the present invention.

Referring to FIGS. 4a, 7 and 8, the 3.3 V device 8a includes the metal layer 25a to activate a VPERI voltage regulator circuit 28 and an inverter circuit 82. The VPERI regulator 28 utilizes the intermediate voltage V1, VDD and VSS, and two signals ACTV and DETECT1B. The signal ACTV is high when the device 8a is enabled and low when the device is in a standby mode. The signal ACTV will remain high unless otherwise shown.

The VPERI regulator 28 comprises a differential circuit 84, a voltage divider 86 and first and second pull-up p-channel metal oxide semiconductor ("PMOS") transistors 88 and 90, respectively. The voltage divider 86 produces an output voltage 92, which is one half of VPERI (normally 2.5 V), or 1.25 V. This half-voltage reference method has the advantage of increasing a high current and low VDD capacity of the transistor 88. The output voltage 92 is compared with the intermediate voltage V1, which is also 1.25 V, by the differential circuit 84. When VPERI drops low, the output voltage 92 also drops low and the differential circuit 84 activates the first pull-up PMOS transistor 88, which pulls VPERI back towards 2.5 V.

Figure 9:
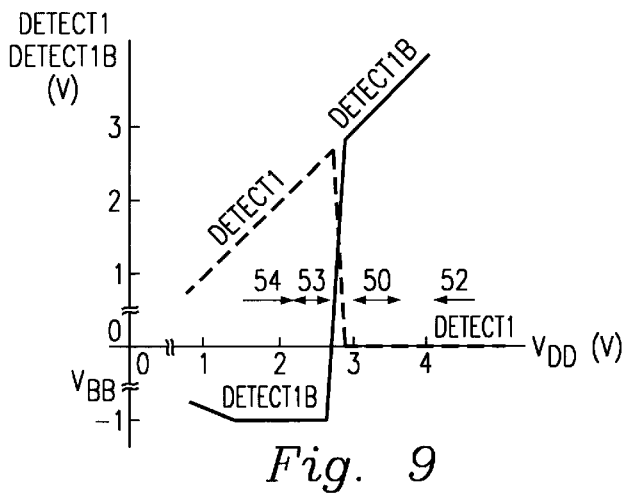
FIG. 9 is a transfer curve of the signals shown in FIGS. 7 and 8.

Referring also to FIGS. 5a and 9, the signal DETECT1B is generated by the inverter circuit 82, which utilizes VDD, VSS and VBB. The inverter circuit 82 receives a signal DETECT1, such that the DETECT1 signal is low when the VDD voltage level is in the operating range 50 or high voltage range 52, and high when the VDD voltage level is in the low voltage ranges 53 or 54. In operation, when the DETECT1 signal is low, the DETECTB signal equals VDD. When the DETECT1 signal is high, the voltage level of the DETECTLB signal equals VBB (−1 V). The advantage of having the voltage level of the DETECT1B signal having a low value of VBB is discussed later.

When the device 8a is in one of the low voltage ranges 53 or 54, the voltage level of the DETECT1B signal equals VBB and the second pull-up transistor 90 is also activated. As a result, a gate-source voltage (not shown) of the second pull-up transistor 90 is very high, and a current ID flowing through the second pull-up transistor can be very high. Therefore, VPERI equals VDD throughout the low voltage range 54 because of the high current drive-ability of the second pull-up transistor 90 in parallel with the transistor 88.

Although not shown, to further improve the performance of the VPERI regulator 28 in a chip with a relatively large size, multiple regulators are placed in various locations around the chip. In this way, a line voltage drop caused by wiring resistance of long VPERI power lines is significantly reduced.

As for the 2.5 V device 8b, the metal layer 25b de-activates the VPERI voltage regulator circuit 28 and the inverter circuit 82, as shown.

Figure 10:
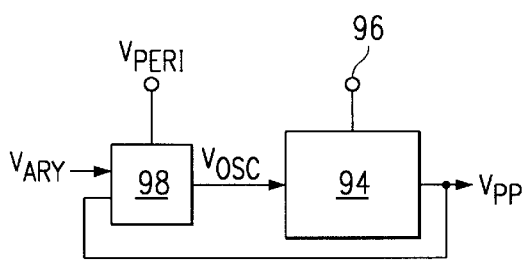
FIG. 10 is a block diagram of a conventional second voltage regulator.

Referring to FIG. 10, the reference numeral 94 designates a conventional VPP voltage regulator. The VPP regulator 94 utilizes a supply voltage 96, which is connected to either VDD or VPERI, and a voltage VOSC. The voltage regulator 94 generates a conventional VPP that is higher than the supply voltage 96 by doubling the supply voltage. The supply voltage is doubled by pumping the supply voltage with the voltage VOSC, which oscillates between VDD and VSS. The pumping of the voltage VOSC is controlled by a conventional 3.6 V voltage detector 98 to regulate a constant voltage level of 3.6 V (VARY (2.0 V) plus 1.6 V). By doubling the supply voltage 96, the conventional VPP remains sufficiently strong, even though limited by the VPP voltage detector 98.

In a first conventional implementation where the supply voltage 96 is connected to VDD, the voltage regulator circuit 94 has a potential for reliability problems. This is because, when VDD is at 4.0 V, an interior node voltage (not shown) may exceed 8.0 V (VDD plus VDD), and to remain reliable, the circuit 94 should not have any internal nodes that exceed 8.0 V. In a second conventional implementation where the supply voltage 96 is connected to VPERI, no interior node voltage will exceed 8.0 V when VDD is at 4.0 V, however, another problem occurs. For example, the voltage regulator circuit 94 has about a 50% input current to output current ratio, that is, for every 20 mA of current the voltage regulator sinks, it sources 10 mA of current. Therefore, the voltage regulator 94 becomes an extraordinary current drain on the VPERI voltage regulator (FIG. 7) in the second conventional implementation.

Figure 11:
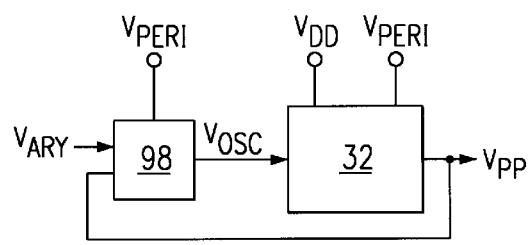
FIG. 11 is a block diagram of the second voltage regulator of the present invention.

Referring to FIG. 11, both versions (3.3 V and 2.5 V) of the device 8 use the improved VPP voltage regulator 32. The VPP regulator 32 utilizes both VDD and VPERI, and the voltage VOSC. By utilizing both VDD and VPERI, when the VDD voltage is higher than 4.0 V, no internal nodes, including a node N2, of the VPP regulator 32 exceed a voltage of 8.0 V. Instead, the lower voltage level of VPERI reduces the voltage of the node N2 to equal VDD plus VPERI, or 6.5 V. Furthermore, although the voltage regulator circuit 32 still has an approximately 50% input current to output current ratio, the regulator circuit 32 is designed to sink a majority of the input current (not shown) from the external VDD power supply, thereby reducing the current drain on the VPERI voltage regulator 28 (FIG. 7).

Figure 12:
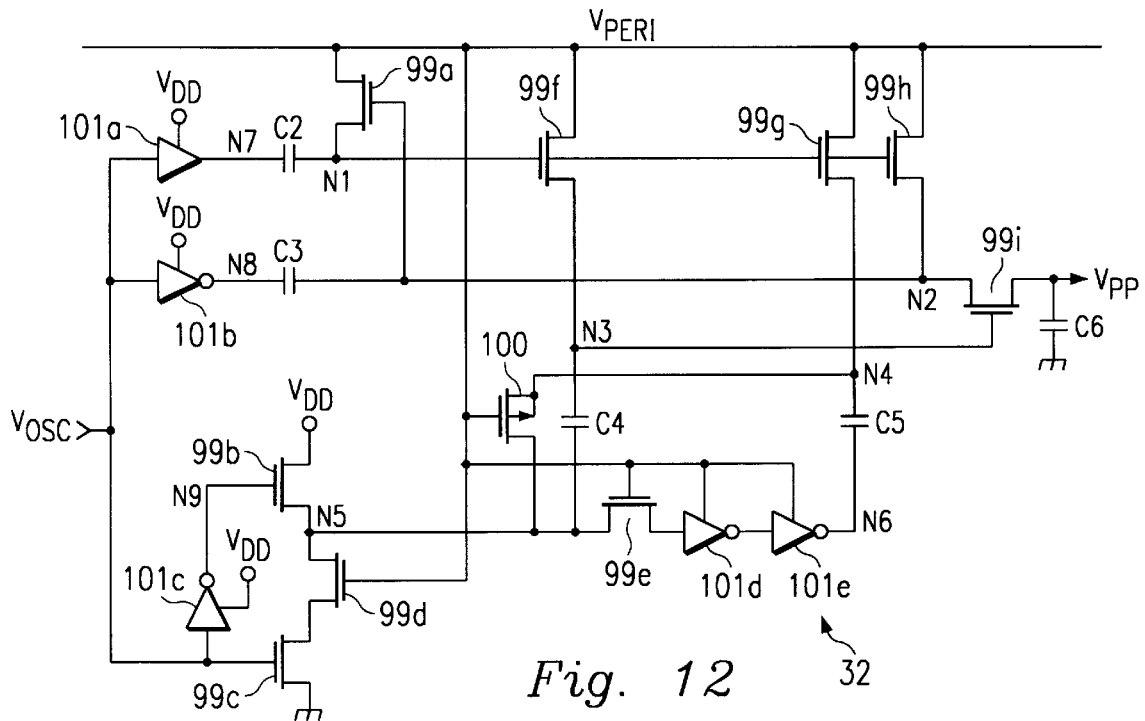
FIG. 12 is a schematic diagram of a second voltage regulator embodying features of the present invention.

Referring to FIG. 12, one implementation of the VPP regulator 32 utilizes both VDD and VPERI to generate VPP. The VPP regulator 32 comprises a plurality of NMOS transistors 99a, 99b, 99c, 99d, 99e, 99f, 99g, 99h, 99i, a PMOS transistor 100, a plurality of capacitors C2, C3, C4, C5, C6, and a plurality of inverters 101a, 101b, 101c, 101d, 101e, each inverter operating between VDD and VSS. The transistors and inverters are also grouped by their voltage pumping operation. The VDD pumping is supported by the NMOS transistors 99b, 99c, 99d and the inverters 101a, 101b, 101c, while the VPERI pumping is supported by the NMOS transistor 99e and the inverters 101d, 101e. The remaining components are utilized to add the two pumping operations. The operation of the VPP regulator 32 can be further described by examining the signals at nodes N1, N2, N3, N4, N5, N6, N7, N8 and N9.

Figure 13:
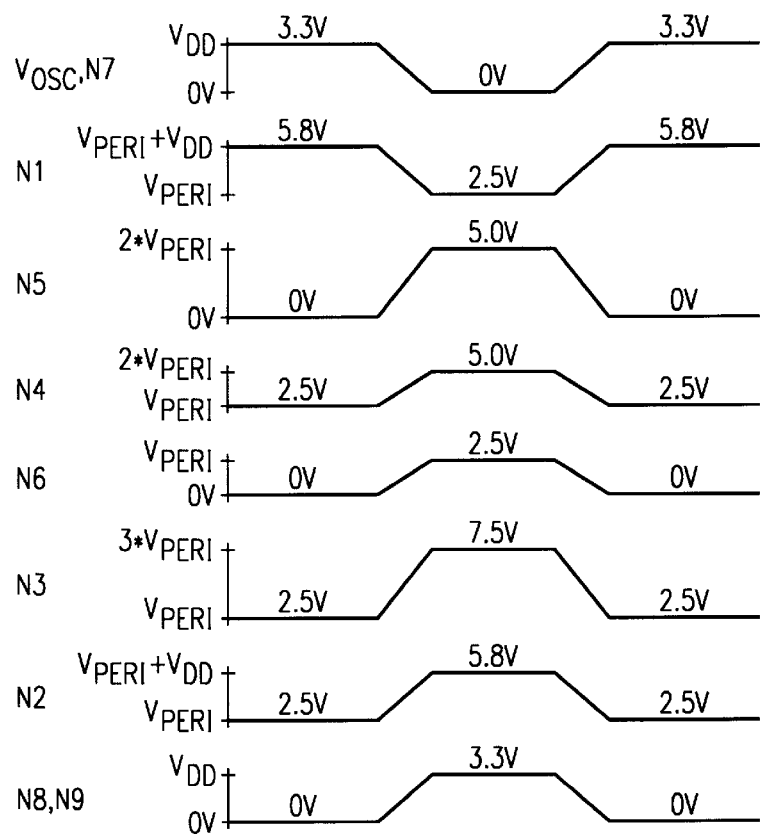
FIG. 13 is a timing diagram of the signals shown in FIG. 12.

Referring also to FIG. 13, waveforms for the signals at nodes N8 and N9 are the inverted waveforms for the signal at node N7 and the voltage VOSC. A waveform for the signal at node N1 is created by pumping the VPERI voltage with the signal at node N7 onto the capacitor C2. A waveform for the signal at node N2 is created by pumping the VPERI voltage with the signal at node N8 onto the capacitor C3. A waveform for the signal at node N5 is created by a combination of the VOSC voltage and the signals at nodes N9, N4 and N6. A waveform for the signal at node N3 is created by pumping the VPERI voltage with the signal at node N5 onto the capacitor C4. As a result, the voltage of the node N2 equals a sum of VDD and VPERI (2.5 V). The capacitor C6 is a large decoupling capacitor to help the voltage detect circuit 98 regulate the VPP voltage to a level of 3.6 V.

Another advantage of the circuit of FIG. 12 is that the VPP voltage level is generated without having any transistor with a gate-source voltage that exceeds reliability limits. In the above described implementation, the PMOS transistor 100 has a constant gate-source voltage of VPERI (2.5 V). When the node N9 equals VDD (3.3 V or 2.5 V), the node N5 equals two times Vperi (5.0 V) so that the NMOS transistor 99b has a maximum gate-source voltage of 2.5 V. When the node N3 equals three times VPERI (7.5 V), the node N2 equals VPERI+VDD (5.0 V or 5.8 V) so that the NMOS transistor 99i has a maximum gate-source voltage of 2.5 V. Likewise, the remaining transistors also have relatively low gate-source voltages.

Figure 14:
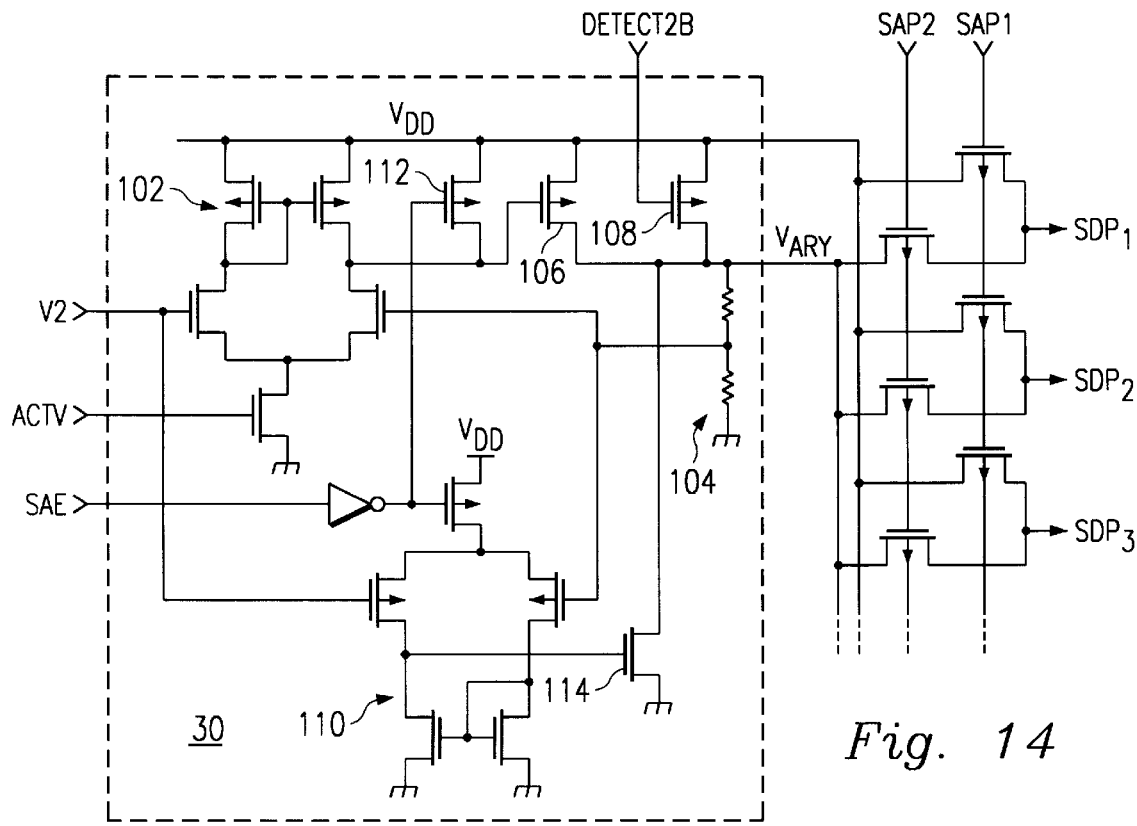
FIG. 14 is a schematic diagram of a third voltage regulator embodying features of the present invention, along with some circuits of the simplified DRAM of FIG. 6.

Referring to FIG. 14, the reference numeral 30 designates a VARY voltage regulator. The VARY regulator 30 is shown driving a series of signal lines SDP1, SDP2, SDP3, etc., referenced generally as SDP and discussed earlier with reference to FIG. 6. Since VDD also drives the signal line SDP, the two drive signals SAP1 and SAP2 (see also FIG. 6) control which of the two voltages VDD or VARY drives the signal line SDP at any one time.

The VARY regulator 30 is similar to the VPERI regulator 28 of FIG. 7 in that it comprises a first differential circuit 102, a voltage divider 104, and first and second pull-up PMOS transistors 106 and 108. The VARY regulator also comprises a second differential circuit 110, a PMOS transistor 112 and a pull-down NMOS transistor 114. The VARY regulator 30 receives the intermediate voltage V2 (1.0 V), the ACTV signal, a sense enable signal SAE and a DETECT2B signal. The DETECT2B signal is similar to the DETECT1B signal (FIG. 8) except that it activates at a lower voltage level (about 2.2 V) instead of about 2.7 V.

Figure 15:
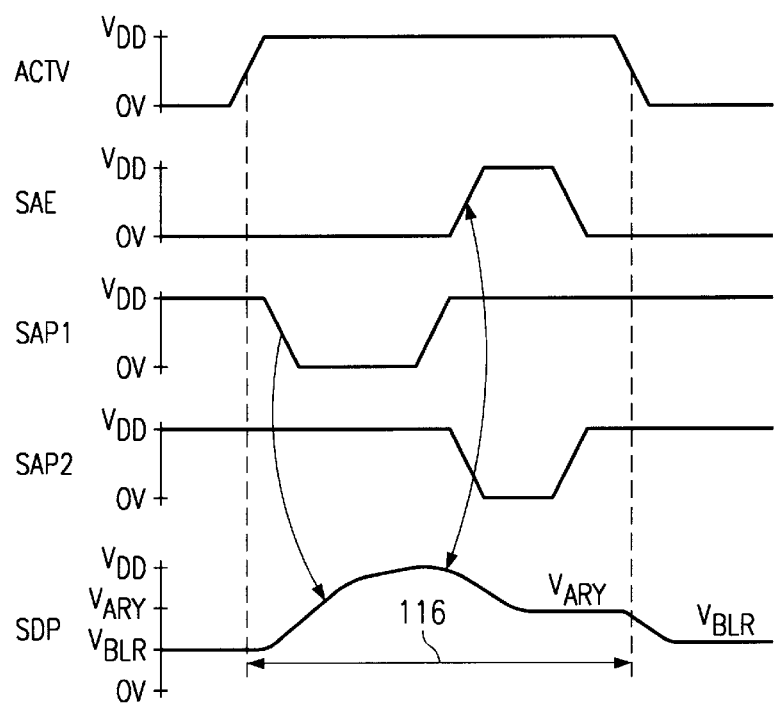
FIG. 15 is a timing diagram of the signals shown in FIG. 14.

Referring also to FIG. 15, VARY regulator 30 operates during an active period 116, which is determined whenever the ACTV signal is high. During this period 116, the VARY regulator 30 operates similar to the VPERI regulator 28 when VARY is too low, discussed above. However, the SAE signal, the second differential circuit 110, and the pull-down NMOS transistor 114 are also used to discharge the VARY voltage level whenever VARY is too high. Since both VARY and VDD drive the SDP signal line, the signal line SDP can be at or near VDD, thereby pulling VARY towards VDD. To discharge the VARY voltage level and pull it back down to 2.0 V, the SAE signal, which becomes high after VARY is connected to the SDP signal, enables the second differential circuit 110 to compare an output of the voltage divider 104 with the intermediate voltage V2. As a result, the second differential circuit 110 activates the pull-down transistor 114 until the voltage level from the voltage divider circuit 104 is equal to V2 (1.0 V), which means that VARY equals 2.0 V.

Referring again to FIG. 6, the bit capacitor C1 has a first plate connected to VPLT and a second plate storing the bit voltage VSN between VSS and VARY. Referring also to FIG. 16, the voltage level of VPLT is typically set to the midpoint between VSS (0 V) and VARY (2.0 V), or 1.0 V. This works well for dielectric material such as $SiO_2$ or $Si_3N_4$. However, characteristics of a dielectric material $Ta_2O_5$ are asymmetrical. For example, the dielectric $Ta_2O_5$ has a positive leakage current I1 when the bit voltage VSN is equal to VSS and a negative leakage current I2 when the bit voltage VSN is equal to VARY. In this conventional implementation, the leakage currents I1, I2 are asymmetrical, that is, the leakage current I1 is disproportionately higher than the leakage current I2. Moreover, the leakage current I1 is too high, causing data stored in the capacitor C1 to be lost.

Referring to FIG. 17, the level of VPLT is adjusted so that the leakage currents for the dielectric $Ta_2O_5$ are more symmetrical. To accomplish this result, the voltage level of VPLT is adjusted to an improved level of 0.5 V, or ¼ of VARY, thereby creating a positive leakage current I3 when the bit voltage VSN is equal to VSS and a negative leakage current I4 when the bit voltage VSN is equal to VARY, such that the leakage currents I3, I4 are fairly symmetrical and relatively low.

Referring to FIG. 18, the voltages VBLR and VPLT are generated by the circuit designated generally by the reference numeral 36. VBLR (1.0 V) is generated by a subcircuit 118a, which generates a voltage exactly halfway between VARY (2.0 V) and VSS (0 V). The subcircuit 118a is a conventional half-voltage regulator, as described in U.S. Pat. No. 4,839,865 to Sato et al. and generates the VBLR voltage while consuming very little current. The present invention also includes a second subcircuit 118b connected between VBLR (1.0 V) and VSS (0 V).

Referring also to FIG. 19, the second subcircuit 118b produces the desired voltage level of VPLT (0.5 V). However, it is not strong enough to pull up VPLT quickly from 0 V because the combined capacitance of all the memory cell capacitors is extremely large. Therefore, a pull-up circuit 120 is enabled to pull VPLT up quickly when VDD is in one of the low voltage ranges 53, 54, 60 (FIGS. 5a, 5b) by connecting it directly to VBLR, which has a stronger current capacity. Furthermore, the VPLT voltage level is pulled up through the sense amplifiers and bit lines (FIG. 6). Finally, when VDD reaches a normal operating level at a time t1, a voltage VUPB transitions low, thereby disabling the pull-up circuit 120, and connecting the second subcircuit 118b to VPLT through a transistor 122.

Although illustrative embodiments of the present invention have been shown and described, a latitude of modification, change and substitution is intended in the foregoing disclosure, and in certain instances, some features of the invention will be employed without a corresponding use of other features. For example, features of some voltage regulators may be incorporated into other regulators, while other features may be removed. Furthermore, additional or alternative components and other circuits may be added without altering the scope of the invention. Accordingly, it is appropriate that the appended claims be construed broadly and in a manner consistent with the scope of the invention.

What is claimed is:

1. A semiconductor memory produced using a plurality of mask layers, the semiconductor memory comprising:

a plurality of memory cells;

a plurality of output circuits;

a plurality of peripheral circuits;

a first external pad for receiving an external positive supply voltage, a level of the external positive supply voltage being in one of either a first operating voltage range or a second operating voltage range, wherein the second operating voltage range is higher than the first operating voltage range;

a second external pad for receiving an external ground supply voltage;

a first voltage regulator generating a first output voltage for the memory cells; and a second voltage regulator generating a second output voltage for the peripheral circuits, the second voltage regulator comprising: a first output transistor, a second output transistor, a first circuit which activates the first output transistor in response to a drop in the second output voltage, and a second circuit which activates the second output transistor in response to the level of the external positive supply voltage being in the first operating voltage range;

wherein a first mask layer is used if the external positive supply voltage level is intended to operate in the first operating voltage range, the first mask layer shorting the first and second output transistors of the second voltage regulator;

wherein a second mask layer is used if the external positive supply voltage level is intended to operate in the second operating voltage range;

such that when the external positive supply voltage level is in the first operating voltage range, the first output voltage level is substantially constant in spite of fluctuations of the external Positive voltage level and the second output transistor is activated so that the second output voltage is connected to the external positive supply voltage through the second output transistor, and when the external positive supply voltage level is in the second operating voltage range, levels of the first and second output voltages are substantially constant in spite of fluctuations of the external positive voltage level, the second output transistor is disabled and the second output voltage is selectively connected to the positive supply voltage through the first output transistor in response to a drop in the second output voltage.

2. The semiconductor memory of claim 1 wherein each of the memory cells comprises a capacitor having a storage voltage of either the external ground power supply voltage level or the first output voltage level.

3. The semiconductor memory of claim 1 wherein the memory cells, the output circuits and the peripheral circuits are the same for the first and second mask layers.

4. A voltage regulator circuit which produces an output voltage comprising:

a terminal for receiving a positive supply voltage capable of operation in a normal mode and a low voltage mode; and a first output transistor which connects the terminal to the output voltage;

a second output transistor which connects the terminal to the output voltage;

a first circuit which activates the first output transistor in response to a drop in the output voltage;

a second circuit which activates the second output transistor in response to the operating mode of the positive supply voltage;

wherein, when the positive supply voltage is operating in the normal mode, the second output transistor is disabled and the output voltage is connected to the positive supply voltage through the first output transistor only in response to a drop in the output voltage; and when the positive supply voltage is operating in the low voltage mode, the second output transistor is activated so that the output voltage is continually connected to the positive supply voltage through the second output transistor.

5. The regulator circuit of claim 4 wherein the second output transistor is a PMOS transistor; and wherein when the positive supply voltage is operating in the low voltage mode, a gate voltage of the second output transistor is at a voltage level less than the ground supply voltage.

6. A voltage regulator circuit which produces an output voltage and output current comprising:

a first positive power supply connected to an external source and supplying a voltage and a current;

a second positive power supply connected to an internal source and supplying a voltage and a current;

an input terminal for receiving an oscillating voltage; and a voltage pumping circuit which receives the oscillating voltage, the first positive supply voltage and the second positive supply voltage and driving the output voltage;

wherein the output voltage is greater than both the first and second positive supply voltages and the output current is sourced from the first and second positive supply currents.

7. The voltage regulator of claim 6 wherein more than half of the output current is sourced from the first positive power supply.

8. The voltage regulator of claim 6 further comprising:

a coupling capacitor having two terminals;

a first NMOS transistor having a gate, a source and a drain, the gate being connected to the first terminal of the coupling capacitor, and the drain being connected to drive the output voltage;

wherein the gate reaches a voltage level of three times the second positive power supply voltage; and wherein the drain drives an output voltage to a level equal to the sum of the first and second positive power supply voltages.

9. The voltage regulator of claim 8 further comprising:

a second NMOS transistor having a gate, a source and a drain and a PMOS transistor having a gate, a source and a drain, the gate of the PMOS transistor being connected to the second positive power supply;

wherein the drain s of the second NMOS transistor and PMOS transistor are connected to the second terminal of the coupling capacitor so that a voltage level of the second terminal of the coupling capacitor is pumped to two times the second power supply voltage level.

10. The voltage regulator of claim 7 further comprising a plurality of transistors, each having a gate and a source, such that a voltage drop across each transistors gate and source never exceeds either the first or second positive power supply voltage.

11. A voltage regulator circuit which produces an output voltage at a desired level comprising:

a positive terminal for receiving a positive power supply;

a ground terminal for receiving a ground power supply;

an input terminal for receiving a signal indicating when the output voltage may be discharged;

a first circuit which charges the output voltage by connecting the output voltage to the positive terminal whenever the output voltage is below the desired level; and a second circuit which discharges the output voltage by connecting the output voltage to the ground terminal whenever the output voltage is above the desired level and the signal so indicates.

12. The voltage regulator of claim 11 further comprising a terminal for receiving a reference voltage, wherein:

the means for charging comprises an NMOS differential circuit for comparing the output voltage with the reference voltage and a PMOS output transistor connected to the positive power supply terminal; and the means for discharging comprises a PMOS differential circuit for comparing the output voltage with the reference voltage and an NMOS output transistor connected to the ground power supply terminal.

13. A voltage regulator for supplying first and second voltages for a memory cell comprising a bit line operating between a bit-high voltage and a bit-low voltage and a capacitor for storing either the bit-high voltage or the bit-low voltage, the capacitor having a first plate connectable to the bit line and a second plate connected to the second voltage of the voltage regulator, the voltage regulator comprising:

means for generating the first voltage such that a level of the first voltage is half-way between the bit-high voltage and the bit-low voltage; and means for generating the second voltage such that a level of the second voltage is half-way between the first voltage and the bit-low voltage.

14. The voltage regulator of claim 13 wherein said first and second circuit include first and second half-voltage regulators, respectively, connected in cascade so that the first half-voltage regulator is powered by the bit-high voltage and the bit-low voltage and generates the first voltage and the second half-voltage regulator is powered by the first voltage and the bit-low voltage and generates the second voltage.

15. The voltage regulator of claim 14 wherein the first half-voltage regulator supplies both the first and second voltages while the second voltage is powering up the second plate.

16. The method of claim 15 wherein each circuit of the first set of circuits comprises a capacitor capable of storing the second external voltage or the first output voltage.

17. The method of claim 16 wherein the memory cells, first and second sets of circuits are identical for each of the first and second mask layers.

18. A method for regulating a supply voltage capable of operation in a first voltage region and a second voltage region to produce an output voltage at an output terminal, the method comprising:

receiving the supply voltage into a supply terminal;

providing a first output transistor between the supply terminal and the output terminal;

providing a second output transistor between the supply terminal and the output terminal;

comparing the output voltage to a predetermined value;

determining when the supply voltage is in the second voltage region;

activating the first output transistor to connect the supply terminal to the output terminal when the predetermined value exceeds the output voltage; and activating the second output transistor to connect the supply terminal to the output terminal when the supply voltage is in the second voltage region.

19. The method of claim 18 wherein the first and second output transistors are PMOS transistors and wherein the step of activating the first output transistor includes applying a first gate voltage to the first output transistor and the step of activating the first output transistor includes applying a second gate voltage to the second output transistor, the second gate voltage being lower than the first gate voltage.

20. A method for producing an output voltage and output current at an output terminal, the method comprising:

receiving a first voltage and current;

receiving a second voltage and current;

receiving an oscillating voltage;

combining the first voltage, the second voltage, and the oscillating voltage to produce the output voltage at a voltage level greater than the voltage level of either the first voltage or the second voltage but less than twice the voltage level of the first voltage; and sourcing a majority of the output current from the first current.

21. The method of claim 20 further comprising:

connecting a gate of a first NMOS transistor to a first plate of a coupling capacitor connecting a drain of the first NMOS transistor to the output voltage terminal;

pumping the first plate of the coupling capacitor with the second positive power supply voltage level;

pumping a second plate of the coupling capacitor with a voltage level of two times the second positive power supply voltage level;

wherein the gate of the first NMOS transistor reaches a voltage level of three times the second positive power supply voltage level.

22. The method of claim 20 further comprising:

connecting a gate of a PMOS transistor to the second power supply;

connecting a drain of a second NMOS transistor to a drain of the PMOS transistor and to the second plate of the coupling capacitor;

wherein the second NMOS transistor and PMOS transistor are used for pumping the second plate of the coupling capacitor.

23. A method for regulating an output voltage at a desired level comprising:

receiving a positive power at a positive terminal;

receiving a ground power at a ground terminal;

receiving a reference voltage at a reference terminal;

receiving a signal for indicating when the output voltage may be discharged;

comparing the reference voltage with the output voltage;

charging the output voltage by connecting it to the positive terminal whenever the output voltage is below the desired level; and discharging the output voltage by connecting it to the ground terminal whenever the output voltage is above the desired level and the signal so indicates.

24. The method of claim 23 wherein the comparing is implemented utilizing a voltage divider, an NMOS differential circuit and a PMOS differential circuit;

the charging is implemented by connecting the output voltage to the positive terminal through a PMOS output transistor; and the discharging is implemented by connecting the output voltage to the ground terminal through an NMOS output transistor.

25. A method for regulating a first and second voltage from a single power supply voltage wherein the power supply voltage may operate in a first low voltage range, a second low voltage range, and a normal range, the method comprising:

regulating the first and second voltage to be equal with the power supply voltage when the power supply voltage is in the first low voltage range;

regulating the first voltage to a first constant voltage level and regulating the second voltage to be equal with the power supply voltage when the power supply voltage is in the second low voltage range; and regulating the first voltage to the first constant voltage level and the second voltage to a second constant voltage level when the power supply voltage is in the normal range.

26. A method for regulating a first and second voltage for a memory cell comprising a bit line operating between a bit-high voltage and a bit-low voltage and a capacitor for storing either the bit-high voltage or the bit-low voltage, the capacitor comprising a first plate connectable to the bit line and a second plate connected to the second voltage, the method comprising:

regulating the first voltage such that the first voltage is half-way between the bithigh voltage and the bit-low voltage; and regulating the second voltage such that the second voltage is half-way between the first voltage and the bit-low voltage.

27. The method of claim 26 wherein the steps of regulating the first and second voltages utilizes two half-voltage generators connected in cascade so that the first half-voltage generator is powered by the bit-high voltage and the bit-low voltage and generates the first voltage and the second half-voltage generator is powered by the first voltage and the bit-low voltage and generates the second voltage.

28. The method of claim 27 further comprising:

powering up both the first and second voltage with the first half-voltage generator until the second voltage is powered up.

29. The voltage regulator of claim 6 farther comprising:

a plurality of nodes connecting the first and second positive power supplies to the output voltage and output current; and wherein the first positive supply voltage does not exceed a first maximum voltage, the second positive supply voltage does not exceed a second maximum voltage which is less than two thirds the first maximum voltage, and wherein a voltage level for each of the plurality of nodes never exceeds twice the first maximum voltage.

30. The voltage regulator of claim 13 further comprising a pull-up circuit to assist the means for generating the second voltage during its initial operation.

31. The method of claim 20 wherein, during the step of combining, a voltage greater than twice the voltage level of the first voltage is never realized between the three received voltages and the output voltage.

32. The method of claim 27 further comprising:
using a pull-up circuit to power up the second voltage; and
disabling the pull-up circuit once the second voltage is powered up.

33. A voltage regulator circuit which produces an output voltage and output current comprising:
a first positive power supply connected to an external source and supplying a voltage and a current;
a second positive power supply connected to an internal source and supplying a voltage and a current;
a coupling capacitor having two terminals;
a first NMOS transistor having a gate, a source and a drain, the gate being connected to the first terminal of the coupling capacitor, and the drain being connected to drive the output voltage; and
wherein the output voltage is greater than both the first and second positive supply voltages and the output current is sourced from the first and second positive supply currents;
wherein the gate reaches a voltage level of three times the second positive power supply voltage; and
wherein the drain drives an output voltage to a level equal to the sum of the first and second positive power supply voltages.

34. The voltage regulator of claim 33 further comprising:
a second NMOS transistor having a gate, a source and a drain and
a PMOS transistor having a gate, a source and a drain, the gate of the PMOS transistor being connected to the second positive power supply;
wherein the drains of the second NMOS transistor and PMOS transistor are connected to the second terminal of the coupling capacitor so that a voltage level of the second terminal of the coupling capacitor is pumped to two times the second power supply voltage level.

35. A method for producing an output voltage and output current at an output terminal, the method comprising:
applying a first external power supply for supplying a voltage and current to a first terminal;
applying a second internal power supply for supplying a voltage and current to a second terminal;
connecting a gate of a first NMOS transistor to a first plate of a coupling capacitor
connecting a drain of the first NMOS transistor to the output voltage terminal;
pumping the first plate of the coupling capacitor with the second positive power supply voltage level;
pumping a second plate of the coupling capacitor with a voltage level of two times the second positive power supply voltage level;
generating the output voltage at a voltage level greater than the voltage level of either the first supply voltage or the second supply voltage but less than twice the voltage level of the first supply voltage; and
sourcing a majority of the output current from the first power supply current;
wherein the gate of the first NMOS transistor reaches a voltage level of three times the second positive power supply voltage level.

36. A method for producing an output voltage and output current at an output terminal, the method comprising:
applying a first external power supply for supplying a voltage and current to a first terminal;
applying a second internal power supply for supplying a voltage and current to a second terminal;
connecting a gate of a PMOS transistor to the second power supply;
connecting a drain of a second NMOS transistor to a drain of the PMOS transistor and to the second plate of the coupling capacitor;
generating the output voltage at a voltage level greater than the voltage level of either the first supply voltage or the second supply voltage but less than twice the voltage level of the first supply voltage; and
sourcing a majority of the output current from the first power supply current;
wherein the second NMOS transistor and PMOS transistor are used for pumping the second plate of the coupling capacitor.

37. A method for producing a semiconductor memory using a plurality of mask layers including a first external pad for receiving a first external voltage, a level of the first external voltage lying in a first voltage range or a second voltage range, wherein the second voltage range is higher than the first voltage range, the method comprising:
providing a first voltage regulator for generating a constant first output voltage to a first set of circuits;
providing a second voltage regulator for generating a second output voltage to a second set of circuits, the second voltage regulator having two transistors connecting the first external voltage to the second output voltage;
selecting one of the two voltage ranges for the first external voltage;
using a first mask layer to short the two transistors of the second voltage regulator if the selected voltage range is the first voltage range so that the first output voltage is substantially constant in suite of fluctuations of the external positive voltage level and the second output voltage corresponds to the external positive supply voltage; and
using a second mask layer if the selected voltage range is the second voltage range so that the first and second output voltages are substantially constant in spite of fluctuations of the external positive voltage level;
determining when the level of the first external voltage is in the second voltage range; and
activating the second output transistor to connect the supply terminal to the output terminal when the level of the supply voltage is in the second voltage region.

* * * * *